United States Patent [19]

Fenoglio et al.

[11] Patent Number: 4,968,780

[45] Date of Patent: Nov. 6, 1990

[54] POLYAMIDE, POLYIMIDE, AND POLYAMIDE-IMIDE POLYMERS OF DIAMINO-T-BUTYLBENZENE

[75] Inventors: David J. Fenoglio, Wheaton; Douglas E. Fjare, Naperville; John L. Melquist, Naperville; Edwin F. Morello, Naperville; Neal R. Nowicki, St. Charles, all of Ill.

[73] Assignee: Amoco Corporation, Chicago, Ill.

[21] Appl. No.: 514,427

[22] Filed: Apr. 25, 1990

Related U.S. Application Data

[60] Division of Ser. No. 277,756, Nov. 30, 1988, which is a continuation-in-part of Ser. No. 212,510, Jun. 28, 1988, Pat. No. 4,946,934.

[51] Int. Cl.$^5$ .............................................. C08G 69/26
[52] U.S. Cl. ...................................... 528/350; 528/353
[58] Field of Search ................................ 528/350, 353

[56] References Cited

U.S. PATENT DOCUMENTS

| | | | |
|---|---|---|---|
| 4,639,344 | 1/1987 | Uemo et al. | 528/350 |
| 4,755,585 | 7/1988 | Hanson | 528/350 |
| 4,831,104 | 5/1989 | Aya et al. | 528/350 |

*Primary Examiner*—Morton Foelak
*Attorney, Agent, or Firm*—Frederick S. Jerome; William H. Magidson; Ralph C. Medhurst

[57] ABSTRACT

Resinous condensation polymers of polycarboxylic acid compounds and aromatic diprimary amines comprising diamino-t-butylbenzens are described. In particular, film-forming polyamides, polyimides and polyamide-imides and their copolymers made using diamino-t-butylbenzenes which have amino groups meta or para to each other on a benzene ring are described. These polymers have some solubility in organic solvents such as N-methylpyrrolidone, a high glass transition temperature, excellent thermal stability, and are useful in films, fibers and composites, and in the electronics industry as electrical component substrates, protective coatings, interlevel dielectrics and the like.

8 Claims, No Drawings

POLYAMIDE, POLYIMIDE, AND POLYAMIDE-IMIDE POLYMERS OF DIAMINO-T-BUTYLBENZENE

This is a division of application Ser. No. 277,756, filed Nov. 30, 1988 which, in turn, is a CIP of 212,510 filed June 28, 1988, now U.S. Pat. No. 4,946,934.

BACKGROUND OF THE INVENTION

This invention relates to resinous condensation polymers of polycarboxylic acid compounds and aromatic diprimary amines comprising diamino-t-butylbenzenes. More particularly, this invention relates to soluble, film-forming polyamides, polyimides and polyamide-imides made using diamino-t-butylbenzenes which have amino groups meta or para to each other on a benzene ring.

Aromatic polyamides, polyimides and polyamide-imides have found extensive use in industry as fibers, composites, molded parts and dielectrics due to their toughness, flexibility, mechanical strength and high thermal stability, and, in the case of polyimides, their lower dielectric constant and high electrical resistivity. Such polymers have been used in both film and coating form as advanced materials for such uses as passivation and insulating coatings, interlevel dielectrics, die attach adhesives, flexible circuit substrates, and the like.

Although current polyamides, polyimides, and polyamide-imides made from, for instance, metaphenylenediamine have the toughness, flexibility and thermal stability necessary to meet the rigorous processing and operating conditions required for certain uses, they do not exhibit the low dielectric constant and reduced moisture uptake shown by lower thermal stability polymers such as polyethylene and polytetrafluoroethylene. The latter polymers, however, are not useful despite their excellent dielectric and moisture uptake properties if thermal stability requirements are demanding. A further difficulty limiting the usefulness of polyethylene and polytetrafluoroethylene is due to to their insolubity in commercial organic solvents.

In addition, many of these applications require deposition of polymer from a solvent in order to form a thin film having the desired properties. Unfortunately, many polyamides, polyamide-imides and particularly polyimides are generally insoluble even in solvents like N-methyl pyrrolidone or N,N-dimethylacetamide which inhibits their usefulness in important areas.

OBJECTS OF THE INVENTION

A general object of this invention is to produce a new resinous condensation polymer of a polycarboxylic acid compound and an aromatic diprimary amine comprising a diamino-t-butylbenzene useful as a film-forming polymer.

Another general object of this invention is to produce a new resinous condensation polymer composition exhibiting a combination of low dielectric constant, low moisture uptake, partial solubility in highly polar organic solvents, and thermal stability.

A more specific object of this invention is to provide improved polyamides, polyimides, and polyamide-imides made using diamino-t-butylbenzenes which have amino groups meta or para to each other on the benzene ring.

Other objects and advantages of the invention will become apparent upon reading the following detailed description and appended claims.

SUMMARY OF THE INVENTION

The general objects of this invention can be attained with a resinous condensation polymer of a polycarboxylic acid compound and an aromatic diprimary amine comprising a diamino-t-butylbenzene. In preferred polymers of this invention the diprimary amine is at least one diamino-t-butylbenzene having amino groups meta or para to each other on the benzene ring.

In another aspect, the invention is an at least partially soluble, film-forming polyamide, polyimide, and polyamide-imide of an appropriately selected polycarboxylic acid compound and at least one diamino-t-butylbenzene selected from the group consisting of 2,4-diamino-t-butylbenzene, 2,5-diamino-t-butylbenzene, 2,6-diamino-t-butylbenzene, and 3,5-diamino-t-butylbenzene.

DETAILED DESCRIPTION OF THE INVENTION

The condensation polymers of the present invention can be prepared from an appropriately selected polycarboxylic acid compound and an aromatic diprimary amine comprising a diamino-t-butylbenzene.

The polymers of this invention are polyamides when they are formed by reaction of the diamino-t-butylbenzene with carboxylic diacids, diesters, and diacyl chlorides. Suitable carboxylic acid compounds include terephthalic acid, isophthalic acid, 2,6-naphthalenedicarboxylic acid, 5-t-butylisophthalic acid, the dimethyl ester of 2,6-naphthalenedicarboxylic acid, etc., the diacyl chlorides of benzene, t-butylbenzene, biphenyl, diphenylether, and naphthalene. Preferably, the polyamide is made from the diacyl chloride of biphenyl, t-butylbenzene, diphenylether, or naphthalene. More preferably, the polyamide is made from 5-t-butylisophthaloyl dichloride or 2,6-naphthoyl dichloride.

The polymers of this invention are polyimides when they are formed by reaction of the diamino-t-butylbenzene with aromatic dianhydrides or their corresponding carboxylic acids or esters. The aromatic dianhydrides useful in this invention include the symmetrical dianhydrides of benzene (PMDA), naphthalene, biphenyl (BPDA), diphenylether (OPAN), benzophenone (BTDA), bis(3,4-dicarboxyphenyl)sulfone dianhydride (SPAN), 2,2-bis(3,4-dicarboxyphenyl)propane dianhydride (IPAN), or 2,2-bis(3,4-dicarboxyphenyl)hexafluoropropane dianhydride (6FDA). Preferred polyimides of this invention are made from the symmetrical dianhydride of biphenyl tetracarboxylic acid or diphenylether tetracarboxylic acid, 2,2-bis(3,4-carboxyphenyl)propane dianhydride, or 2,2-bis(3,4-carboxyphenyl)hexafluoropropane dianhydride. More preferably, the polyimide is made from 2,2-bis(3,4-carboxyphenyl)hexafluoropropane dianhydride.

The polymers of this invention are polyamide-imides when they are formed by reaction of the diamino-t-butylbenzene with the acyl chloride of trimellitic acid anhydride (TMAC), or mixtures of di and tetra functional polycarboxylic acid compounds.

All of these resinous condensation polymers are at least partially soluble in highly polar organic solvents such as N-methylpyrrolidone (NMP), gamma-butyrolactone (GBL), and N,N-dimethylacetamide (DMAC). The solubility of these polymers provides processability, for example, in film-forming. Typically, polymer concentrations upward from about 1 weight percent are useful in film-forming using highly polar solvents. Any particulates or insolubles in the polymer due to formation of a gel or crosslinking can be partitioned out, for example, by filtration, before casting.

Briefly, the resinous condensation polymers of this invention can be made by any technique used in the prior art to form polyamide, polyimide, and polyamide-imide polymers provided the aromatic diprimary amines employed comprise at least one diamino-t-butylbenzene.

Diprimary amines useful in this invention include diamino-t-butylbenzenes which have amino groups meta or para to each other on a benzene ring, i.e., 2,4-diamino-t-butylbenzene (2,4-DATB), 2,5-diamino-t-butylbenzene (2,5-DATB), 2,6-diamino-t-butylbenzene (2,6-DATB), and 3,5-dimaino-t-butylbenzene (3,5-DATB).

Polyamide, polyimide and polyamide-imide polymers made from 3,5-diamino-t-butylbenzene are described and claimed in application Ser. No. 212,510, filed on June 28, 1988, in the names of David J. Fenoglio, Douglas E. Fjare, Edwin F. Morello and Neal R. Nowicki, which is hereby incorporated by reference.

In the formation of resinous condensation polymers of this invention, a diamino-t-butylbenzene may be used alone or in conjunction with aliphatic diamines or other aromatic diamines. Suitable aliphatic amines contain 2 to about 12 carbon atoms, e.g., ethylenediamine, trimethylenediamine, hexamethylenediamine, dodecamethylenediamine, etc. In those cases where an aliphatic diamine containing 3 to 12 carbon atoms comprises more than 10 to 20 weight percent of the diprimary amine, the reaction product has a lower melting point and/or higher solubility than product produced from all aromatic amines.

Suitable aromatic diamines include metaphenylenediamine, oxybisaniline, methylenebisaniline, 4,4'-diaminodiphenyl propane, diaminodiphenylsulfide, 4,4'-diaminodiphenylsulfone, 3,4'-diaminodiphenylsulfone, 4,4'-diaminobenzopheneone, toluenediamine, metaxylene diamine, etc. Generally, the diamino-t-butylbenzene can range from about 5 mol % to 100 mol %, preferably at least 20 mol %, of the total diamines. Typically, for best results it is preferable to use only aromatic diamines since the thermal properties of the polymers decrease when aliphatic diamines are employed.

The diamino-t-butylbenzene can be any reasonably pure source of diamino-t-butylbenzene, preferably polymer grade having a purity of 98% or higher. For example, a suitable 2,4-diamino-t-butylbenzene is prepared by a process comprising nitration of t-butylbenzene, recovery and purification of 2,4-dinitro-t-butylbenzene, as, for example, by washing, extraction and/or crystallization using water and/or organic compounds such as alkanes or alcohols, hydrogenation of purified 2,4-dinitro-t-butylbenzene, recovery and purification of 4-(t-butyl)-1,3-phenylenediamine, and recovery and, if desired, purification of 2,4-diamino-t-butylbenzene. Hexane and ethanol are preferred organic compounds used in purifications by washing, extraction and/or crystallization. Typically, best results are obtained when the source of 2,4-diamino-t-butylbenzene used is chosen to reduce the content of foreign aromatic compounds in the reaction mix.

In somewhat greater detail, polymers of this invention are preferably made by dissolving aromatic diamine, preferably polymer grade diamine, in a solvent such as N-methylpyrrolidone or N,N-dimethylacetamide and adding carboxylic acid compound at a temperature between about 0° C. and 100° C., preferably in a range from about 10° to about 40° C., to make a solution of the polyamic acid polymer. When polyimide or polyamide-imide polymers are made, a second stage of reaction is required to imidize the amic acid groups. Imidization can be accomplished either thermally, preferably at a temperature in a range from about 200° to about 400° C., or chemically, preferably using pyridine and acetic anhydride. Typically, solutions of the polyamic acid polymer from about 5 to about 50 weight percent, preferably, about 10 to about 40 weight percent, are employed.

In general, the molar ratio of diamine to polycarboxylic acid compound can range from about 1.2:1 to about 1:1.2. However, best results are attained using substantially equal molar portions of the diamine and the carboxylic acid compound in making the polymer, although a small excess of one or the other component, or even a monofunctional compound, can be used in order to terminate the polymer with either carboxylic acid or amine groups to control molecular weight.

The resulting solution of polymer can be spread on a substrate, and the solvent evaporated leaving the polymer in the form of a layer or coating. Any particulates or insolubles in the polymer due to formation of a gel or crosslinking can be partitioned out, for example, by filtration, before coating. The coating or film in the case of a polyimide is then heated, preferably in an inert gas such as nitrogen, to complete the imidization process. Films and coatings of the polymers are desirably thin, preferably between about one and about twenty microns in thickness, more preferably between about one and about ten microns.

The polymers of this invention are useful as fibers, composites and the like, and both free-standing films and coatings can be made in the form of flexible substrates for electrical components, interlevel dielectrics, passivation, etc.

The polyamides, polyimides, and polyamide-imides of this invention have high glass transition temperature, preferably above about 300° C., high temperature of onset of degradation in nitrogen, preferably above about 450° C., at least partial solubility in organic solvents, preferably at least about fifteen weight percent in N-methylpyrrolidone for the polyamides, preferably at least about ten weight percent in N-methylpyrrolidone for the polyamide-imides, and preferably at least about one weight percent in N-methylpyrrolidone for the polyimides. They also have lower density, preferably at least less than 1.3 g/cc, and lower uptake of moisture at 100% relative humidity (R.H.), preferably less than about two weight percent for the polyimides, preferably less than about five weight percent for the polyamide-imides, and preferably less than about eight weight percent for the polyamides.

The following Examples will serve to illustrate certain embodiments of the herein disclosed invention. These Examples should not, however, be construed as limiting the scope of the novel invention as there are many variations which may be made thereon without departing from the spirit of the disclosed invention, as those of skill in the art will recognize.

EXAMPLES General

All percents used are weight percents. Test procedures used to characterize the polymers of this invention are are follows:

Dielectric Constant

Measurements of dielectric constant were made on thin films (0.7 to 2 mils thick) cast from polyamic acid solutions onto glass plates and thermally cured. The measurements were made using a two-fluid cell technique as described in ASTM D150. The reproducibility of the dielectric constant measurement using this technique is about ±2%.

Moisture Absorption and Change in Dielectric Constant

Moisture absorption measurements were made on wafer-level capacitor structures. Three-layer structures of aluminum/polymer/aluminum were fabricated on silicon wafers as set forth in U.S. Ser. No. 212,511, filed on June 28, 1988 now abandoned. Aluminum thickness was 0.6 microns, polymer thickness was 1 to 2 microns, and capacitor size was 0.01 square centimeters. Capacitance of the structures was measured between 50° C. and 300° C. over a range of frequencies. The capacitors were tested to 300° C., allowed to cool, and immediately reheated to 300° C. The moisture absorption values were calculated based on the difference between the measured 1 MHz dielectric constants at 50° C. for the first and second heats of the test according to the formula:

$$\text{Equilibrium Moisture (100\% R.H.)} \approx \frac{2\Delta\epsilon}{0.4}$$

which formula is based upon 2 percent equilibrium moisture per unit change in epsilon, and where $\Delta\epsilon$ is the change in dielectric constant between first and second heat. The start of the first heat is assumed to be at 40% R.H. as the wafers were allowed to equilibrate for two days at 40% R.H. prior to testing. The start of the second heat is assumed to be approximately 0% R.H. as the wafers were reheated immediately after the water was driven off during the first heat. The change in dielectric constant at 40% R.H. is the percent difference between the measured 1 MHz dielectric constants at 50° C. for the first and second heats of the test.

Glass Transition Temperature

The glass transition temperature ($T_g$) of the polymers was measured by differential scanning calorimetry. A temperature ramp rate of 20° C./min was used for all determinations.

Temperature of Onset of Degradation

The temperature of onset of degradation (TGA) of the polymers was measured by thermogravimetric analysis in air and nitrogen. The onset temperature is the temperature at which 1 weight percent weight loss is found at a heating rate of 10° C./min. Measurements were made on thin films cast from polymer solutions onto glass plates and thermally cured.

Example 1

In this and following examples the 3,5-diamino-t-butylbenzene used was prepared form 5-t-butylisophthalic acid by the improved process described and claimed in application Ser. No. 249,656, filed on Sept. 27, 1988, now abandoned in the name of Douglas E. Fjare, which is hereby incorporated by reference.

In a flame dried two liter 3-necked round bottomed flask equipped with a thermometer-nitrogen inlet tube and stirred was placed 19.68 g (0.12 mol) of 3,5-diamino-t-butylbenzene and 275 g of dimethylacetamide. This was mixed and cooled under nitrogen to 10° C. Solid 5-t-butylisophthaloyl chloride, 31.08 g (0.12 mol) was added with mixing over 30 min while a temperature of no greater than 10° C. was maintained. The mixture was allowed to come to room temperature with mixing and heated to 30°-35° C. for 3 hr. The resulting polymer was precipitated and washed in water. After drying, 41 g (97.6% yield) of a white, powdery solid was obtained. This material has an inherent viscosity of 0.70 in dimethylacetamide (0.4 wt.%) at 30° C. The glass transition temperature was found to be 322° C. as measured by DSC. Thermal gravimetric analysis in nitrogen shows decomposition at 431° C. The density of this polyamide was determined to be 1.078 using density gradient columns.

Example 2

In a manner similar to Example 1 above, 16.43 g of 3,5-diamino-t-butylbenzene was reacted with 20.3 g of terephthaloyl dichloride in 93.7 g of dimethylacetamide. The resulting polyamide has an inherent viscosity of 1.63. The glass transition temperature of the polymer is 337° C.

Example 3

In a manner similar to Example 1, 19.68 grams of 3,5-diamino-t-butylbenzene was reacted with 24.36 grams of isophthaloyl dichloride in 250 g of dimethylacetamide. The resulting polyamide has an inherent viscosity of 0.55. The glass transition temperature of the polyamide is 300° C.

Example 4

To a clean and dry 100 mL reaction kettle were added 5.402 grams of 3,5-diamino-t-butylbenzene and 14.611 grams of 2,2-bis(3,4-dicarboxyphenyl)hexafluoropropane dianhydride; all operations were performed under a nitrogen atmosphere. To the monomers were added 59.99 grams of N-methylpyrrolidone and the resulting mixture was stirred for 17 hours. The resulting polyamic acid solution contained 25% by weight solids and has an inherent viscosity of 1.06 dL/g at 25° C. The solution was refrigerated until needed.

A film of the 6FDA/3,5-DATB polyamic acid was prepared by casting the resin onto a soda-lime glass in a dust-free environment. The polyamic acid film was thermally imidized to the corresponding polyimide film by heating in a forced-air oven for one hour at 80° C., then 200° C., and finally 300° C. The resulting film was removed from the glass plate after cooling to room temperature by soaking in water. The dielectric constant of the dried polyimide film is 2.77 (0% R.H.) at 1 MHz.

Example 5

A copolyimide having the composition 1 6FDA : 0.8 3,5-DATB : 0.2 APBP was prepared in the following manner. A mixture of 2.028 grams of 3,5-DATB and 1.135 grams of 4,4'-bis(p-aminophenoxy)biphenyl (APBP) was dissolved in 15.057 grams of N-methylpyrrolidone and reserved. In a separate kettle, 6.842 grams of 6FDA was dissolved in 34.869 grams of N-methylpyrrolidone. The mixed diamines solution was added over a period of 30 minutes to the 6FDA solution with stirring. An additional 6.748 grams of N-methylpyrrolidone were added to the solution. All manipulations were performed under a nitrogen atmosphere. The resulting copolyimide solution was 15.0% solids and showed an inherent viscosity of 0.92 dL/g at 25° C.

Example 6

Into a dry flask containing a nitrogen atmosphere were added 28.21 g of dimethylacetamide and 4.14 g of 3,5-diamino-t-butylbenzene. To this stirred solution was added 5.264 g trimellitic anhydride acid chloride while maintaining the temperature between 20° and 20° C. After addition was complete, the solution temperature was maintained at 30° C. for an additional 5 hours. The resulting polymer was precipitated in a high speed blender and washed in distilled water to a pH of 4.5. After air drying, the polymer was vacuum dried at 60° C. to give 8.1 g of a powdery solid in 96% yield. The initial inherent viscosity was 0.167; after curing 30 minutes at 260° C., the inherent viscosity was 0.278 as measured at 25° C. in dry N-methylpyrrolidone with a Cannon-Fenske viscometer at a 0.5 g/100 mL concentration. $T_g$ of the polymer is 331° C. and temperature of onset of degradation under nitrogen is 446° C. Polymer density is 1.33 g/mL.

Example 7

In a manner similar to Example 6, a TMA end-capped polymer was prepared from 7.09 g of oxybisaniline, 2.46 g of 3,5-diamino-t-butylbenzene, 10 g of trimellitic anhydride acid chloride, and 0.48 g of trimellitic anhydride in 50 mL of dimethylacetamide. The initial inherent viscosity of the polymer was 0.294; after curing 30 minutes at 260° C., the inherent viscosity was 0.538.

Example 8

Some physical properties of the polyimides of this invention are given in Table I below.

TABLE I

Physical Properties of Films and Wafer Level Coatings of Some 3,5-DATB Polyimides and Copolyimides

| Dianhydride | Dielectric Constant at 0% R.H. and 1 MHz | Moisture Absorption (Wafer Level) (%) | $T_g$ (°C.) | Temperature of Onset of Degradation in $N_2$ (°C.) |
|---|---|---|---|---|
| OPAN | 3.18 | 1.2 | 291 | 510 |
| IPAN | 2.99 | 1.9 | 309 | 473 |
| 6FDA | 2.77 | 0.7 | 310 | 486 |
| 6FDA[1] | 2.97 | 0.8 | 349 | 458 |
| 6FDA[2] | 3.07 | — | 296 | 467 |

[1]Copolymer of 3,5-DATB and 4,4'-bis(p-aminophenoxy)biphenyl
[2]Copolymer of 3,5-DATB and 4,4'-diaminodiphenylether

Example 9

In this example 2,4-diamino-t-butylbenzene was prepared from t-butylbenzene by a process comprising nitration and hydrogenation.

A mixed acid nitrating medium was prepared containing nitric acid (196.1 g or 70% $HNO_3$) and sulfuric acid (437.2 g of conc. $H_2SO_4$). Then t-butylbenzene (268 g, 2.0 moles) was placed into a flask and cooled to a temperature below 5° C. and vigorously stirred while the nitrating medium was added to the flask over a 20 min period. After an additional 30 min period of mixing at a temperature below 5° C., mixture was allowed to separate and the aqueous (bottom) layer was drawn off and discarded. This nitration process was repeated at a temperature below 45° C. using a mixed acid nitrating medium containing nitric acid (392.2 g of 70% $HNO_3$) and sulfuric acid (874 g of conc. $H_2SO_4$).

The organic product was washed with water, then slurried with 500 mL of hexane at a temperature of 60° C. and filtered. The product was crystallized from ethanol. After drying, 359 g of 2,4-dinitro-t-butylbenzene was recovered, 80% of theoretical for the nitration step.

A portion of this 2,4-dinitro-t-butylbenzene (100 g), ethanol (500 mL) and a hydrogenation catalyst (1.25 g of 10% Pd/C) were placed in a one-liter autoclave which was purged with nitrogen and pressurized to 600 psig with hydrogen. The temperature of the autoclave containing the reaction slurry was raised to 100° C. and held at 100° C. for 45 min to complete the reduction reaction.

After the autoclave cooled to room temperature and the pressure released, the solution was filtered to remove the solid catalyst and a crude product was recovered from the solvent by stripping under vacuum.

This crude product was slurried with hot hexane, then cooled and scratched to initiate crystallization. The crystals were filtered to recover 59.37 g (81% yield) of purified 4-(t-butyl)-1,3-phenylenediamine. The melting range of this product measured 62°-65° C. Product prepared as in this example was used as the source of 2,4-diamino-t-butylbenzene in the following examples.

Example 10

Into a flame dried 300 mL 3-necked round bottomed flask equipped with a thermometer, nitrogen inlet tube and stirrer were placed 9.84 g (0.06 mole) of 2,4-diamino-t-butylbenzene and 147 g of N,N'-dimethylacetamide. The contents of the flask were mixed and cooled to 10° C. under nitrogen. Solid terephthaloyl chloride, 12.18 g (0.06 mole), was added with mixing over 20 minutes while a temperature below 10° C. was maintained. The contents of the flask were allowed to come to room temperature with mixing and then heated to a temperature in the range of 30°-35° C. for three hours. The resulting polymer was precipitated and washed in water. After drying, 16.6 g (94% yield) of a white powdery solid was obtained. This material had an inherent viscosity of 0.41 in N,N'-dimethylacetamide (0.4 wt. %) at 30° C. The glass transition temperature was 331° C. as measured by DSC. Thermal gravimetric analysis in nitrogen shows 1% decomposition at 373° C. To increase the inherent viscosity, the powdered polymer was heated at 325° C. under vacuum (0.1 mm) for 24 hours. The resulting polyaramide had an inherent viscosity of 0.86 and a glass transition temperature of 334° C.

Example 11

In a manner similar to Example 10 above, 9.84 g of 2,4-diamino-t-butylbenzene was reacted with 12.18 g of isophthaloyl dichloride in 147 g of dimethylacetamide. The resulting polyamide had an inherent viscosity of 0.24 and a glass transition temperature of 283° C. After thermal treatment the polyamide had an inherent viscosity of 0.51 and a glass transition temperature of 292° C.

Example 12

In a manner similar to Example 10, 9.84 g of 2,4-diamino-t-butylbenzene was reacted with 15.54 g of 5-t-butyl isophthaloyl dichloride in 137.5 g of dimethylacetamide. The resulting polyamide had an inherent viscosity of 0.33 and a glass transition temperature of 292° C. After thermal treatment the polyamide had an inherent viscosity of 0.82 and a glass transition temperature of 298° C.

Example 13

Into a flame dried 300 mL 3-necked round bottomed flask equipped with a thermometer, nitrogen inlet tube, stirrer and pressure equalizing dropping funnel (with drying tube) were placed 9.84 g (0.06 mole) of 2,4-diamino-t-butylbenzene and 117 g of N,N'-dimethylacetamide. The contents of the flask were mixed and cooled to 10° C. under nitrogen. Then 10.98 g (0.06 mole) of adipoyl chloride were slowly added to the mixture over a 15 min period during which the flask was maintained at temperature below 10° C. The contents of the flask were allowed to come to room temperature with mixing and then heated to a temperature of 40° C. and held at 40° C. for 3 hrs. The resulting polymer was then precipitated and washed in water. After drying, 14.25 g (87% yield) of a white powdery solid was obtained. The material had an inherent viscosity of 0.27 in N,N'-dimethylacetamide (0.4 wt. %) at 30° C. The glass transition temperature was found to be 182° C. as measured by DSC. Thermal gravimetric analysis in nitrogen shows 1% decomposition at 347° C. Heat treatment of this powdered polymer produced an increase in inherent viscosity. The best result was to heat the polymer at 200° C. under vacuum (0.1 mm) for 24 hrs. This gave an inherent viscosity of 0.34. The resulting glass transition temperature was 183° C.

Example 14

In this example a polyimide polymer was made by reacting 2,4-diamino-t-butylbenzene with 3,3',4,4'-tetracarboxybiphenyl dianhydride. The property enhancements observed for this polymer are also obtained in polymers made with other aromatic dianhydrides or anhydride acid chlorides.

The polymer described here was prepared by reaction of the diamine with the dianhydride in N-methylpyrrolidone solution. The process involved a two stage polymerization. During the first stage, a polyamic acid was formed by reaction between the two starting materials. The second stage was the chemical imidization of the amic acid groups using pyridine and acetic anhydride. The polymer inherent viscosities reported here were measured at 30° C. in NMP solution using aliquots of the reaction mixture diluted to a polymer concentration of 0.5 g/dL.

The starting materials, 4.11 g of 2,4-diamino-t-butylbenzene (0.0250 mole) and 7.59 g 3,3',4,4'-tetracarboxybiphenyl dianhydride (0.0258 mole), were weighed into a 200 mL reaction vessel. After purging the reaction vessel with nitrogen for 35 min, 100 mL of N-methylpyrrolidone, which had been cooled in an ethylene glycol/dry ice bath, was added to the reaction vessel. The mixture was stirred and allowed to warm to room temperature. After 21.5 hrs, a 1.25 mL aliquot of the solution was withdrawn, diluted to a total volume of 25 mL with NMP, and used to determine the inherent viscosity of the polyamic acid (0.11 dL/g). Reaction was continued for 7.5 hrs, at which time the inherent viscosity was determined to be 0.20 dL/g. After an additional 17.2 hrs the polyamic acid inherent viscosity measured 0.32 dL/g. The reaction mixture was then heated to 54° C. for 3 hrs after which the inherent viscosity of the polyamic acid was 0.17 dL/g. To the remainder of the reaction mixture, 5 mL of pyridine was added, and 30 min later 5 mL of acetic anhydride was added. The stirring continued overnight. A 1.47 mL aliquot of the resulting polyimide solution was then diluted with enough NMP to give a 25 mL total solution volume, and the inherent viscosity of the polyimide was determined to be 0.29 dL/g.

The fact that the product of the reaction was a homogeneous solution demonstrates that the polyimide made from 2,4-diamino-t-butylbenzene and biphenyl dianhydride is soluble in NMP. The polyimide was precipitated by pouring the reaction mixture into a solution of water and methanol in blender, separated from the liquid, refluxed in water/methanol for about three hours, dried, and designated Example 14.

Example 15

In this example a polyamide-imide polymer was made by reacting 2,4-diamino-t-butylbenzene with trimellitic acid chloride in N,N'-dimethylacetamide.

The starting material, 8.22 g of 2,4-diamino-t-butylbenzene (0.05 mole) was weighed into a 100 mL reaction vessel and then dissolved in 56.23 g of N,N'-dimethyacetamide. During a 1.75 hr reaction period, small increments (1-2 g) of trimellitic acid chloride to total 10.53 g (0.05 mole) were added to the solution which was maintained at a temperature below 40° C. The reaction was continued for 6 hrs, at which time a solid was precipitated from the reaction solution with water in a blender and recovered by filtration. The inherent viscosity of this solid was determined to be 0.08 dL/g.

A portion of the solid was placed in a 260° C. oven for 35 min, after which the inherent viscosity of the polymer was 0.13 dL/g.

Example 16

In a manner similar to Example 14 a polyimide polymer was made by reacting 1.514 g of 2,4-diamino-t-butylbenzene, with 4.096 g of 2,2-bis(3,4-dicarboxyphenyl)hexafluoropropane in 13.155 g of N-methylpyrrolidone. The resulting polyamic acid had an inherent viscosity of 0.34 dL/g. A film cast from the polyamic acid and thermally imidized had a glass transition temperature of 365° C.

Comparative Example A

A polyimide was prepared from oxybisaniline and 3,3',4,4'-tetracarboxybenzophenone dianhydride in NMP by a method similar to that described in the example, above. A 200 mL reaction vessel was used and the amounts of materials are listed below:

| | |
|---|---|
| oxybisaniline | 4.40 g (0.0220 mole) |
| benzophenone dianhydride | 7.08 g (0.0220 mole) |
| NMP | 100 mL |

4.6 mL each of pyridine and acetic anhydride were used to chemically imidize the product. The inherent viscosity of the polyamic acid was 1.27 dL/g. However, the inherent viscosity of the polyimide, which was designated Example A, was not measured because this product gelled. The behavior of this polyimide demonstrates that one advantage polyimides containing 2,4-diamino-t-butylbenzene have over other polyimides is enhanced solubility in organic solvents.

Example 17

Some physical properties of the polyamide, polyimide, and polyamide-imide polymers of Examples 10-16 and A are given in Table II below.

TABLE II

Polyamide, Polyimide, And Polyamide-imide Polymers of 2,4-diamino-t-butylbenzene

| Example No. | Acidic Compound | IV | $T_g$ (°C.) | TGA (°C.) Nitrogen | Air |
|---|---|---|---|---|---|
| 10 | terephthaloyl chloride | 0.41 0.86 | 331 334 | 373 | 352 |
| 11 | isophthaloyl chloride | 0.24 0.51 | 283 292 | 383 | 346 |
| 12 | 5-t-butyl-isophthaloyl chloride | 0.33 0.82 | 292 298 | 379 | 350 |
| 13 | adipoyl chloride | 0.27 0.34 | 182 183 | 347 | 334 |
| 14 | 3,3',4,4'-tetra-carboxybiphenyl dianhydride | 0.29 | nd | 477 | 428 |
| 15 | trimellitic anhydride acid chloride | 0.13 | nd | 330 | 360 |
| 16 | 6FDA | 0.49 | 365 | 468 | 428 |
| A | 3,3',4,4'-tetra-carboxybenzo-phenone dianhydride | gel | 275 | 544 | 516 |

IV = Inherent viscosities. The polyaramide inherent viscosities reported here were measured at 30° C. in DMAC solution diluted to a polymer concentration of 0.4 g/dL.
TGA = Temperature at which 1% weight loss is found.
nd = not detected These results show the polyamide, polyimide, and polyamide-imide polymers made from 2,4-diamino-t-butylbenzene can be used in film, fiber or coating application where the high temperature properties of these types of polymers are needed. The solubility of these polymers will provide improved processability. However, the effect of the t-butyl moiety is to raise the thermal properties of the polymer.

We claim:

1. A resinous condensation polymer of tetracarboxylic acid compound and a aromatic diprimary amine comprising a diamino-t-butylbenzene.

2. The polymer of claim 1 wherein the diprimary amine comprises at least one diamino-t-butylbenzene having amino groups meta or para to each other on the benzene ring.

3. The polymer of claim 2 comprising an at least partially soluble, film-forming polyimide made from of at least one diamino-t-butylbenzene selected from the group consisting of 2,4-diamino-t-butylbenzene, 2,5-diamino-t-butylbenzene, 2,6-diamino-t-butylbenzene, and 3,5-diamaino-t-butylbenzene, and at least one carboxylic acid compound selected from the group consisting of aromatic dianhydrides and their corresponding acids and esters.

4. The polyimide of claim 3 wherein the carboxylic acid compound is a symmetrical dianhydride of benzene, naphthalene, biphenyl, diphenylether, 2,2-bis(3,4-carboxyphenyl)propane dianhydride or 2,2-bis(3,4-carboxyphenyl)hexafluoropropane dianhydride.

5. The polyimide of claim 3 wherein the carboxylic acid compound is the symmetrical dianhydride of biphenyl tetracarboxylic acid or diphenylether tetracarboxylic acid, 2,2-bis(3,4-carboxyphenyl)propane dianhydride, or 2,2-bis(3,4-carboxyphenyl)hexafluoropropane dianhydride.

6. The polyimide of claim 5 wherein the carboxylic acid compound is 2,2-bis(3,4-carboxyphenyl)hexafluoropropane dianhydride.

7. The polyimide of claim 3, or claim 4, or claim 5, or claim 6 wherein the diamino-t-butylbenzene is 2,4-diamino-t-butylbenzene.

8. The polyimide of claim 3, or claim 4, or claim 5, or claim 6 wherein the diamino-t-butylbenzene is 3,5-diamino-t-butylbenzene.

* * * * *